United States Patent
Guan et al.

(10) Patent No.: US 10,305,512 B2
(45) Date of Patent: May 28, 2019

(54) ENCODING METHOD AND APPARATUS

(71) Applicant: HUAWEI TECHNOLOGIES, CO., LTD., Shenzhen, Guangdong (CN)

(72) Inventors: Kun Guan, Hangzhou (CN); Jinan Leng, Hangzhou (CN); Gongyi Wang, Hangzhou (CN); Shaohui Quan, Hangzhou (CN); Jianqiang Shen, Hangzhou (CN)

(73) Assignee: HUAWEI TECHNOLOGIES, CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/924,007

(22) Filed: Mar. 16, 2018

(65) Prior Publication Data
US 2018/0205393 A1 Jul. 19, 2018

Related U.S. Application Data

(63) Continuation of application No. PCT/CN2016/099593, filed on Sep. 21, 2016.

(30) Foreign Application Priority Data
Oct. 31, 2015 (CN) .......................... 2015 1 0733615

(51) Int. Cl.
*H03M 7/30* (2006.01)
*G06F 17/30* (2006.01)

(52) U.S. Cl.
CPC ........... *H03M 7/6011* (2013.01); *G06F 17/30* (2013.01); *G06F 17/3033* (2013.01);
(Continued)

(58) Field of Classification Search
CPC .... H03M 7/3084; H03M 7/3086; H03M 7/30; H03M 7/3088; H03M 7/4006;
(Continued)

(56) References Cited

U.S. PATENT DOCUMENTS 5,532,694 A * 7/1996 Mayers ............... G06T 9/005 341/67
5,874,908 A * 2/1999 Craft ................ G06T 9/005 341/87

(Continued)

FOREIGN PATENT DOCUMENTS

CN 102156727 A 8/2011
CN 102870116 A 1/2013
(Continued)

OTHER PUBLICATIONS

Anonymous: "LZ77 and LZ78", Wikipedia, Oct. 6, 2015, XP055510700, 4 pages.
(Continued)

*Primary Examiner* — Linh V Nguyen
(74) *Attorney, Agent, or Firm* — Womble Bond Dickinson (US) LLP

(57) ABSTRACT

An encoding method and apparatus is described. In an encoding method, when a first target sub-block in a target block is obtained, a hash operation is first performed on the first target sub-block. Then, a first hash table is queried for a corresponding hash value according to an operation result, and a corresponding location in a reference block is found according to the hash value obtained by means of query, that is, first reference data is found. The first piece of target data in the first target sub-block is matched with the first reference data, and second target data in the target block is matched with second reference data in the reference block. In this way, an approximate location is predetermined, so that a range in which matching needs to be performed is narrowed, a data compression time is reduced, and data compression efficiency is improved.

20 Claims, 5 Drawing Sheets

(52) U.S. Cl.
CPC .... *G06F 17/30495* (2013.01); *H03M 7/3084* (2013.01); *H03M 7/3091* (2013.01)

(58) Field of Classification Search
CPC ............. H03M 7/3059; H03M 7/3091; H03M 7/6058; H03M 7/6076; H03M 7/60; H03M 7/6011
USPC ...................................... 341/66–67, 106, 107
See application file for complete search history.

(56) References Cited

U.S. PATENT DOCUMENTS

| | | | |
|---|---|---|---|
| 7,110,540 B2 | 9/2006 | Rajagopal et al. | |
| 7,538,695 B2* | 5/2009 | Laker | H03M 7/3086 341/51 |
| 8,694,703 B2* | 4/2014 | Hans | G06F 3/0613 707/797 |
| 9,419,648 B1* | 8/2016 | Guilford | H03M 7/40 |
| 9,473,168 B1* | 10/2016 | Gopal | H03M 7/3086 |
| 9,584,155 B1* | 2/2017 | Gopal | H03M 7/42 |
| 2003/0204703 A1 | 10/2003 | Rajagopal et al. | |
| 2007/0061546 A1* | 3/2007 | Berger | G06F 17/30336 711/202 |
| 2009/0097654 A1* | 4/2009 | Blake | G06F 17/30949 380/277 |
| 2009/0307251 A1 | 12/2009 | Heller et al. | |
| 2011/0154169 A1* | 6/2011 | Gopal | H03M 7/3084 714/807 |
| 2014/0188822 A1* | 7/2014 | Das | H03M 7/30 707/693 |
| 2014/0223029 A1* | 8/2014 | Bhaskar | H03M 7/3088 709/247 |
| 2017/0302936 A1* | 10/2017 | Li | H04N 19/176 |

FOREIGN PATENT DOCUMENTS

| | | |
|---|---|---|
| CN | 103379160 A | 10/2013 |
| CN | 105426413 A | 3/2016 |

OTHER PUBLICATIONS

Anonymous: "Lempel-Ziv-Welch", Wikipedia, Oct. 23, 2015, XP055510728, 10 pages.
Sadakane K et al: "Improving the Speed of LZ77 Compression by Hashing and Suffix Sorting", IEICE Transactions on Fundamentals of Electronics,Communications and Computer Sciences, Engineering Sciences Society, Tokyo, JP, vol. E83-A, No. 12, Dec. 1, 2000, pp. 2689-2698, XP001036426.
Anonymous: "Lempel-Ziv-Welch (LZW) Compression. lzw—compgt", Dec. 31, 2008, XP055510767, 7 pages.
Artur Ferreira et al: "On the Use of Suffix Arrays for Memory-Efficient Lempel-Ziv Data Compression", arxiv.org, Cornell University Library, 201 Olin Library Cornell University Ithaca, NY 14853, Mar. 25, 2009, XP080316875, 12 pages.
Torsten Suel et al: LZ77-Based Delta Compression in: "Lossless Compression Handbook", Dec. 31, 2003, Academic Press, Elsevier Science (USA), San Diego, XP055512958, 4 pages.

* cited by examiner

ENCODING METHOD AND APPARATUS

CROSS-REFERENCE TO RELATED APPLICATIONS

This application is a continuation of International Application No. PCT/CN2016/099593, filed on Sep. 21, 2016, which claims priority to Chinese Patent Application No. 201510733615.X, filed on Oct. 31, 2015. The disclosures of the aforementioned applications are hereby incorporated by reference in their entireties.

TECHNICAL FIELD

This disclosure relates to the field of data compression technologies, and in particular, to an encoding method and apparatus.

BACKGROUND

A Delta algorithm is one of lossless data compression technologies, and is used to compute Delta encoding between a new file and a reference file that has been stored in a system. For example, when a new file needs to be stored, the new file is separately matched with multiple reference files that have been stored in the system. If similarity between the new file and one of the multiple reference files exceeds a preset threshold, Delta encoding corresponding to the new file is computed, only the Delta encoding needs to be stored in the system, and the new file does not need to be stored. The new file may be restored according to the reference file that is similar to the new file and the Delta encoding corresponding to the new file. In this way, during storage of a similar file, the file is compressed by using Delta encoding, so that storage space can be greatly reduced.

Currently, XDelta encoding is a commonly-used Delta encoding algorithm. A core idea of the XDelta encoding is to search a reference block for a sub-block that matches a target block. For example, generally, if three or four consecutive bytes are the same, it is considered that matching succeeds.

However, in XDelta encoding, matching is performed byte by byte. A larger data amount of a reference block leads to heavier workload in a matching process and a longer time that is consumed. Consequently, data compression efficiency is relatively low.

SUMMARY

Embodiments discussed herein provide an encoding method and apparatus, to resolve a technical problem of relatively low data compression efficiency that is caused when Delta encoding is used.

According to a first aspect, an encoding method is provided, including:

obtaining a first target sub-block, where the first target sub-block belongs to a target block;

performing a hash operation on the first target sub-block to obtain a first key value, and querying a first hash table according to the first key value, where a hash value that is in the first hash table and that is corresponding to a key value indicates an address of reference data in a reference block; and if a first hash value corresponding to the first key value is found in the first hash table, obtaining, according to the first hash value, first reference data corresponding to an address indicated by the first hash value, matching a first piece of target data in the first target sub-block with the first reference data, and matching second target data in the target block with second reference data in the reference block, where the second target data is another piece of target data subsequent to the first piece of target data in the first target sub-block, and the second reference data is another piece of reference data subsequent to the first reference data in the reference block; and generating a first encoding sequence according to a matching result of the first piece of target data and a matching result of the second target data, where the first encoding sequence includes a matching length and an offset, the matching length is used to indicate a length of target data that is successfully matched, and the offset is used to indicate a location of data matching the target data that is successfully matched.

In an embodiment of this application, when a target sub-block (for example, referred to as the first target sub-block) in the target block is obtained, the hash operation may be first performed on the target sub-block; then the first hash table is queried for the corresponding hash value according to an operation result, and a corresponding location is found in the reference block according to the hash value obtained by means of query, that is, the first reference data is found, so that backward matching may be performed on the first target sub-block from the location (that is, the first piece of target data in the first target sub-block is matched with the first reference data, and the second target data in the target block is matched with the second reference data in the reference block). In this way, an approximate location is predetermined, so that a range in which matching needs to be performed is narrowed, a data compression time is reduced, and data compression efficiency is improved.

With reference to the first aspect, in a first possible embodiment of the first aspect, before the querying a first hash table according to the first key value, the method further includes:

obtaining a reference data block from the reference block according to a first step, where each reference data block includes n digits of reference data, the first target sub-block includes n digits of target data, and n is a positive integer; and constructing the first hash table, where the key value in the first hash table is obtained by performing the hash operation on the reference data block.

That is, the first hash table may be constructed in advance according to reference data in the known reference block, so as to be used subsequently. In an embodiment of this application, during construction of the first hash table, a data amount of reference data participating in each hash operation needs to be equal to a data amount (that is, a data amount of data included in one target sub-block) of template data participating in each operation when matching is performed on the target block. Otherwise, matching may not be performed because obtained operation results have different lengths.

With reference to the first aspect or the first possible embodiment of the first aspect, in a second possible embodiment of the first aspect, before the generating a first encoding sequence, the method further includes: matching target data prior to the first target sub-block in the target block with other reference data prior to the first reference data in the reference block.

That is, in addition to backward matching mentioned above, the first target sub-block and the target data prior to the first target sub-block in the target block may be forward matched with the first reference data and the other reference data prior to the first reference data in the reference block, until matching cannot be performed. In this way, as much data can be matched at a time as possible, so as to effectively reduce a quantity of matching times, also reduce a quantity of encoding sequences generated subsequently, and lighten system load.

With reference to the second possible embodiment of the first aspect, in a third possible embodiment of the first aspect, the first encoding sequence further includes target data that is not successfully matched, and the target data that is not successfully matched is target data between the first piece of target data that is successfully matched and a last piece of target data that is successfully matched and that is corresponding to a previous encoding sequence.

During matching, there may be data that cannot be matched, that is, data that is not successfully matched. In this case, to restore original target data as accurately as possible during decoding, the data that is not successfully matched also needs to be recorded. The encoding sequence in this application provides a field used to store the target data that is not successfully matched, so that a decoding result obtained during subsequent decoding is as consistent with the original target data as possible.

With reference to any one of the first aspect or the first possible embodiment to the third possible embodiment of the first aspect, in a fourth possible embodiment of the first aspect, after the performing the hash operation on the first target sub-block to obtain a first key value, the method further includes:

querying a second hash table according to the first key value, where a hash value that is in the second hash table and that is corresponding to a key value indicates an address of target data in the target block; and if a second hash value corresponding to the first key value is found in the second hash table, obtaining first target data according to the second hash value, matching the first piece of target data in the first target sub-block with the first target data, matching the second target data in the target block with third target data in the target block, and matching target data prior to the first target sub-block in the target block with other target data prior to the first target data in the target block, to obtain a first matching result, where the second target data is another piece of target data subsequent to the first piece of target data in the first target sub-block, and the third target data is another piece of target data subsequent to the first target data in the target block; where a matching result obtained by matching the first piece of target data in the first target sub-block with the first reference data and matching second target data in the target block with second reference data in the reference block is a second matching result; and the generating a first encoding sequence includes:

selecting a matching result with a larger data amount of matched target data from the first matching result and the second matching result, and generating the first encoding sequence according to the selected matching result, where the first encoding sequence further includes an indication bit, and the indication bit is used to: when an amount of matched target data in the first matching result is greater than that in the second matching result, indicate that data matching the target data that is successfully matched is in the target block, or the indication bit is used to: when an amount of matched target data in the second matching result is greater than that in the first matching result, indicate that data matching the target data that is successfully matched is in the reference block.

That is, in an embodiment of this application, the first hash table and the second hash table are provided, and for a key value, query and matching may be performed on the two hash tables. A same hash value may appear in both the first hash table and the second hash table, and two matching results may be obtained when query and matching are performed on the tables according to operation results. In this case, a matching result with a larger data amount may be selected for encoding, so that matching accuracy can be improved, and a compression rate can be increased.

With reference to any one of the first aspect or the first possible embodiment to the third possible embodiment of the first aspect, in a fifth possible embodiment of the first aspect, if the hash value corresponding to the first key value is not found in the first hash table, before the generating a first encoding sequence, the method further includes:

querying a second hash table according to the first key value, where a hash value that is in the second hash table and that is corresponding to a key value indicates an address of target data; and if the hash value corresponding to the first key value is found in the second hash table, obtaining first target data according to the hash value that is in the second hash table and that is corresponding to the first key value, matching the first piece of target data in the first target sub-block with the first target data, and matching the second target data in the target block with third target data in the target block, where the second target data is another piece of target data subsequent to the first piece of target data in the first target sub-block, and the third target data is another piece of target data subsequent to the first target data in the target block; and the first encoding sequence further includes an indication bit, used to indicate that the data matching the target data that is successfully matched is in the target block.

In an embodiment of this application, the first hash table and the second hash table are provided, and for a key value, query and matching may be performed on the two hash tables. If a hash value appears in only one of the hash tables, only one matching result is obtained when query and matching are performed on the tables according to operation results. In this case, the matching result may be directly encoded. In consideration of this case, the encoding sequence in this application provides the indication bit, and the indication bit may indicate whether the data matching the target data that is successfully matched is in the target block or the reference block. In this way, during subsequent decoding, a location of data matching that is successfully matched and that is corresponding to the encoding sequence can be accurately found, so as to increase decoding accuracy. In addition, a data location may be directly indicated by using the indication bit in the encoding sequence, and no extra storage space is used for recording such information, so that storage space can be effectively reduced, and the indication can be directly used in decoding, so as to improve decoding efficiency.

With reference to the fourth possible embodiment or the fifth possible embodiment of the first aspect, in a sixth possible embodiment of the first aspect, the method further includes:

updating the second hash table, so that the hash value that is in the second hash table and that is corresponding to the first key value indicates an address of the first piece of target data in the first target sub-block.

That is, the hash value that is corresponding to the first key value and that is stored in the second hash table may be updated by the current hash value corresponding to the first key value. Updating herein is replacing an original hash value in the second hash table with a new hash value. In this way, it can be ensured that the hash value in the second hash table is updated in time, and a success rate of next matching is improved.

With reference to any one of the first aspect, or the first possible embodiment to the third possible embodiment of the first aspect, in a seventh possible embodiment of the first aspect, after the first hash table is queried according to the first key value, if the hash value corresponding to the first key value is not found in the first hash table, a second hash table is queried according to the first key value; and if the hash value corresponding to the first key value is not found in the second hash table, the second hash table is updated, so that the hash value that is in the second hash table and that is corresponding to the first key value indicates an address of the first piece of target data in the first target sub-block.

With reference to any one of the first aspect, or the first possible embodiment to the third possible embodiment of the first aspect, in an eighth possible embodiment of the first aspect, the method further includes:

after the performing a hash operation on the first target sub-block to obtain a first key value, querying a second hash table according to the first key value; and if the hash value corresponding to the first key value is not found in the second hash table, updating the second hash table, so that the hash value that is in the second hash table and that is corresponding to the first key value indicates an address of the first piece of target data in the first target sub-block.

That is, if the hash value corresponding to the first key value is not found in the second hash table, the hash value corresponding to the first key value may be inserted into a corresponding location in the second hash table, that is, the second hash table is updated according to the hash value corresponding to the first key value. In this way, when the first key value appears again next time, the corresponding hash value may be found in the second hash table.

According to a second aspect, an encoding apparatus is provided, including:

a memory, configured to store an instruction; and a processor, configured to execute the instruction so as to:

obtain a first target sub-block, where the first target sub-block belongs to a target block;

perform a hash operation on the first target sub-block to obtain a first key value, and query a first hash table according to the first key value, where a hash value that is in the first hash table and that is corresponding to a key value indicates an address of reference data in a reference block; and if a first hash value corresponding to the first key value is found in the first hash table, obtain, according to the first hash value, first reference data corresponding to an address indicated by the first hash value, match a first piece of target data in the first target sub-block with the first reference data, and match second target data in the target block with second reference data in the reference block, where the second target data is another piece of target data subsequent to the first piece of target data in the first target sub-block, and the second reference data is another piece of reference data subsequent to the first reference data in the reference block; and generate a first encoding sequence according to a matching result of the first piece of target data and a matching result of the second target data, where the first encoding sequence includes a matching length and an offset, the matching length is used to indicate a length of target data that is successfully matched, and the offset is used to indicate a location of data matching the target data that is successfully matched.

With reference to an embodiment of the second aspect, in a first possible embodiment of the second aspect, the processor is further configured to:

before querying the first hash table according to the first key value, obtain a reference data block from the reference block according to a first step, where each reference data block includes n digits of reference data, the first target sub-block includes n digits of target data, and n is a positive integer; and construct the first hash table, where the key value in the first hash table is obtained by performing the hash operation on the reference data block.

With reference to the second aspect or the first possible embodiment of the second aspect, in a second possible embodiment of the second aspect, the processor is further configured to:

before generating the first encoding sequence, match target data prior to the first target sub-block in the target block with other reference data prior to the first reference data in the reference block.

With reference to the second possible embodiment of the second aspect, in a third possible embodiment of the second aspect, the first encoding sequence further includes target data that is not successfully matched, and the target data that is not successfully matched is target data between the first piece of target data that is successfully matched and a last piece of target data that is successfully matched and that is corresponding to a previous encoding sequence.

With reference to any one of the second aspect or the first possible embodiment to the third possible embodiment of the second aspect, in a fourth possible embodiment of the second aspect, the processor is further configured to:

after performing the hash operation on the first target sub-block to obtain the first key value, query a second hash table according to the first key value, where a hash value that is in the second hash table and that is corresponding to a key value indicates an address of target data in the target block; and if a second hash value corresponding to the first key value is found in the second hash table, obtain first target data according to the second hash value, match the first piece of target data in the first target sub-block with the first target data, match the second target data in the target block with third target data in the target block, and match target data prior to the first target sub-block in the target block with other target data prior to the first target data in the target block, to obtain a first matching result, where the second target data is another piece of target data subsequent to the first piece of target data in the first target sub-block, and the third target data is another piece of target data subsequent to the first target data in the target block, and a matching result obtained by matching the first piece of target data in the first target sub-block with the first reference data and matching second target data in the target block with second reference data in the reference block is a second matching result; and select a matching result with a larger data amount of matched target data from the first matching result and the second matching result, and generate the first encoding sequence according to the selected matching result, where the first encoding sequence further includes an indication bit, and the indication bit is used to: when an amount of matched target data in the first matching result is greater than that in the second matching result, indicate that data matching the target data that is successfully matched is in the target block, or the indication bit is used to: when an amount of matched target data in the second matching result is greater than that in the first matching result, indicate that data matching the target data that is successfully matched is in the reference block.

With reference to any one of the second aspect or the first possible embodiment to the third possible embodiment of the second aspect, in a fifth possible embodiment of the second aspect, the processor is further configured to:

if the hash value corresponding to the first key value is not found in the first hash table, query a second hash table according to the first key value before generating the first encoding sequence, where a hash value that is in the second hash table and that is corresponding to a key value indicates an address of target data; and if the hash value corresponding to the first key value is found in the second hash table, obtain first target data according to the hash value that is in the second hash table and that is corresponding to the first key value, match the first piece of target data in the first target sub-block with the first target data, and match the second target data in the target block with third target data in the target block, where the second target data is another piece of target data subsequent to the first piece of target data in the first target sub-block, and the third target data is another piece of target data subsequent to the first target data in the target block; and the first encoding sequence further includes an indication bit, used to indicate that the data matching the target data that is successfully matched is in the target block.

With reference to the fourth possible embodiment or the fifth possible embodiment of the second aspect, in a sixth possible embodiment of the second aspect, the processor is further configured to:

update the second hash table, so that the hash value that is in the second hash table and that is corresponding to the first key value indicates an address of the first piece of target data in the first target sub-block.

With reference to any one of the second aspect or the first possible embodiment to the third possible embodiment of the second aspect, in a seventh possible embodiment of the second aspect, the processor is further configured to:

after querying the first hash table according to the first key value, if the hash value corresponding to the first key value is not found in the first hash table, query a second hash table according to the first key value; and if the hash value corresponding to the first key value is not found in the second hash table, update the second hash table, so that the hash value that is in the second hash table and that is corresponding to the first key value indicates an address of the first piece of target data in the first target sub-block.

With reference to any one of the second aspect or the first possible embodiment to the third possible embodiment of the second aspect, in an eighth possible embodiment of the second aspect, the processor is further configured to:

after performing the hash operation on the first target sub-block to obtain the first key value, query a second hash table according to the first key value; and if the hash value corresponding to the first key value is not found in the second hash table, update the second hash table, so that the hash value that is in the second hash table and that is corresponding to the first key value indicates an address of the first piece of target data in the first target sub-block.

According to a third aspect, an encoding apparatus is provided, and the encoding apparatus includes a module configured to perform embodiments of the method according to the first aspect.

According to the solutions provided in this application, matching on the target sub-block can be completed faster, a data compression time is reduced, and data compression efficiency is improved over other techniques.

DESCRIPTION OF EMBODIMENTS

Figure 1:
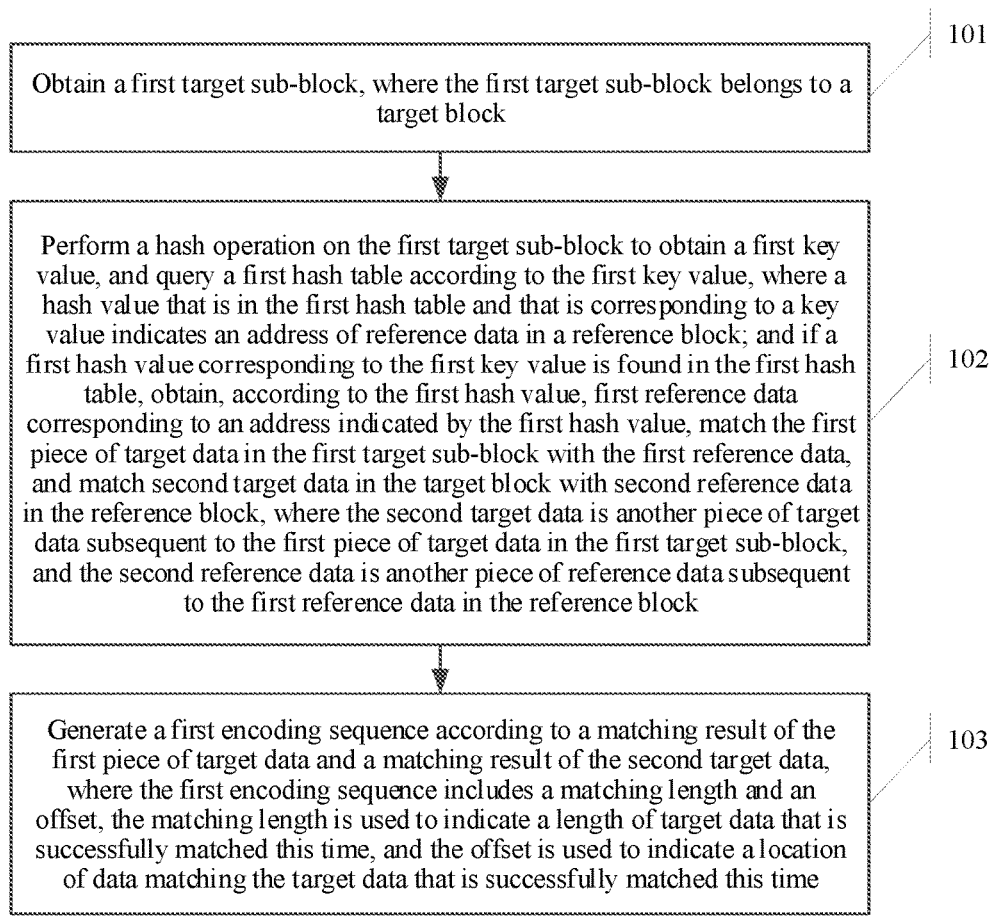
FIG. 1 is a flowchart of an encoding method according to an embodiment of the present invention.

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Currently, in XDelta encoding, matching needs to be performed byte by byte. Therefore, a larger data amount of a reference block leads to heavier workload in a matching process and a longer time that is consumed. Consequently, data compression efficiency is relatively low.

The foregoing problem is considered in the embodiments of the present invention. When a target sub-block is obtained, a hash operation is first performed on the target sub-block, then a first hash table corresponding to a reference block is queried for a corresponding hash value according to an operation result, and a corresponding location is found in the reference block according to the hash value obtained by means of query, that is, corresponding reference data is found, so that the target sub-block may be matched from the location, for example, backward matching may be performed on the target sub-block by using the found reference data as a start point. In this way, an approximate location is predetermined, so that a range in which matching needs to be performed is narrowed, system workload is greatly reduced, a data compression time is reduced, data compression efficiency is improved, and system performance is also improved.

The embodiments of the present invention have a more obvious advantage when there are a relatively large quantity of to-be-compressed target blocks. For example, there are fifty to-be-compressed target blocks, and a size of each target block is 8 K bits (bit), that is, a total size of the target blocks is 400 K bits. In addition, there is a reference block, and a size of the reference block is 8 K bits. In the embodiments of the present invention, a method for encoding each of the fifty target blocks is described below. After all the fifty target blocks are encoded according to the method in the embodiments of the present invention, when a compression rate is, for example, 50%, a size of an obtained compression result is an encoding sequence of 200 K bits plus the reference block of 8 K bits, and is much less than 400 K bits. Therefore, storage space is reduced.

In the specification, the foregoing description is used as an example. A target block is a data block whose size is 8 K bits, and a reference block is a reference block whose size is 8 K bits. Generally, the size of the target block is the same as the size of the reference block. In practice, the size of the target block and the size of the reference block may be set to other values, and only an example is provided herein. Target data is data in the target block, reference data is data in the reference block, a target sub-block includes n consecutive digits of target data in the target block, and n is a positive integer.

The following further describes the embodiments of the present invention in detail with reference to the accompanying drawings of the specification.

Referring to FIG. 1, an embodiment of the present invention provides an encoding method, and description of a procedure of the method is as follows:

Step 101: Obtain a first target sub-block, where the first target sub-block belongs to a target block.

Step 102: Perform a hash operation on the first target sub-block to obtain a first key value, and query a first hash table according to the first key value, where a hash value that is in the first hash table and that is corresponding to a key value indicates an address of reference data in a reference block; and if a first hash value corresponding to the first key value is found in the first hash table, obtain, according to the first hash value, first reference data corresponding to an address indicated by the first hash value, match a first piece of target data in the first target sub-block with the first reference data, and match second target data in the target block with second reference data in the reference block, where the second target data is another piece of target data subsequent to the first piece of target data in the first target sub-block, and the second reference data is another piece of reference data subsequent to the first reference data in the reference block.

Step 103: Generate a first encoding sequence according to a matching result of the first piece of target data and a matching result of the second target data, where the first encoding sequence includes a matching length and an offset, the matching length is used to indicate a length of target data that is successfully matched, and the offset is used to indicate a location of data matching the target data that is successfully matched.

In this embodiment of the present invention, the first target sub-block may include n consecutive digits of data in any to-be-compressed target block, and n is a positive integer. For example, it may be specified in advance that a first amount of consecutive data participates in each hash operation, and in this case, the first target sub-block includes the first amount of consecutive data, that is, the first target sub-block may be regarded as a data combination including the first amount of consecutive data, or referred to as a data segment. That is, the first amount is n.

In an actual application, it may be considered that the first target sub-block herein is a part of consecutive data in a target block, that is, a target sub-block in the target block. That is, an actual target block may include a relatively large amount of data (a data amount of the included data is greater than n).

For example, there are a total of eight target blocks, a size of each target block is 8 K bits, and n is 4, that is, the first target sub-block includes four digits of consecutive data in one of the eight target blocks.

Therefore, the first target sub-block in this embodiment of the present invention is only a name, and does not represent an actual case. For example, in an actual case, the first target sub-block may be an entire target block, or the first target sub-block may be a target sub-block in an entire target block.

When the first target sub-block needs to be encoded, a hash operation may be performed, according to a hash operation algorithm, on the data included in the first target sub-block. The hash operation algorithm herein may be a hash operation algorithm that is specified in advance, and the hash operation algorithm is the same as a hash operation algorithm corresponding to the first hash table.

For example, a hash table is in a key (key)-value (value) form. For example, the hash operation is performed on the data in the first target sub-block, a key is obtained, and a key and a value are in a one-to-one correspondence in the first hash table, so that a corresponding value may be found in the first hash table by means of query according to the obtained key. If there is only one reference block, the value may be used to indicate a distance between an address of the first reference data corresponding to the value and a head address of the reference block.

A hash value indicates a distance between addresses of two pieces of data. Therefore, it may be considered that one hash value is corresponding to one data combination, for example, one hash value is corresponding to one target sub-block or one reference data block, and one reference data block includes n digits of reference data. Alternatively, it may be considered that one hash value is corresponding to one piece of data, for example, one hash value is corresponding to the first piece of data in a target sub-block or corresponding to the first piece of data in a reference data block.

For example, a key and a value are in a one-to-one correspondence in the first hash table. A process of searching the first hash table may be: performing the hash operation on the data in the first target sub-block to obtain a first key, and searching the first hash table for a key that is the same as the first key. If the first key is found in the first hash table, the first key in the first hash table is corresponding to a first value, and the first value may be considered as a first hash value corresponding to the first key corresponding to the first target sub-block.

For example, the data included in the first target sub-block in the target block is BCFG, and the BCFG is four pieces of consecutive data. In this example, each piece of data in the first target sub-block is a character, and in practice, each piece of data in the first target sub-block may be a character, a number, or another possible data type. A key value (Key) may be obtained by performing the hash operation on the first target sub-block, and may be, for example, referred to as the first key value. According to the first key value, the first hash table may be queried for a corresponding hash value (for example, referred to as the first hash value). For example, the hash operation is performed on the first target sub-block to obtain the first key, and the first hash table is searched for the key that is the same as the first key. Provided that the key (for example, referred to as a second key) that is the same as the first key is found in the first hash table, the second key in the first hash table is corresponding to a value (the first hash value). For the found second key corresponding to the first hash value, the first reference data matching the first hash value may be determined, and the first reference data is in the reference block. In this way, the first piece of target data in the first target sub-block may be matched with the first reference data, and the second target data in the target block may be matched with the second reference data in the reference block, that is, after the first reference data is determined, the first target sub-block and target data subsequent to the first target sub-block in the target block may be backward matched (or may be referred to as matched backward) with the first reference data and other reference data subsequent to the first reference data in the reference block, until matching cannot be performed, to obtain a matching result corresponding to the first key value.

For example, the data included in the first target sub-block is BCFG, the BCFG is four pieces of consecutive data, and the reference block is AEBCFGHIJKLMN. If the determined first reference data is data B in the reference block, starting from the data B, the first target sub-block is matched with the data B in the reference block and other data subsequent to the data B. In this example, obviously, all the BCFG in the first target sub-block can be successfully matched because the solution provided in this embodiment of the present invention is backward matching. After the first target sub-block is successfully matched, matching may continue to be performed on other target data subsequent to the first target sub-block in the target block. For example, the target block is BCFGHIJKPQA, and the first target sub-block is BCFG, after the first target sub-block is successfully matched, matching may continue to be performed on other target data starting from data H, until matching cannot be performed. Obviously, in this example, a final matching result obtained by means of matching is BCFGHIJK, that is, a first matching result in this application document.

For another example, the data included in the first target sub-block is BCFG, the BCFG is four pieces of consecutive data, and the reference block is AEBCFQHIJKLMN. If the determined first reference data is data B in the reference block, starting from the data B, the first target sub-block may be matched with the data B in the reference block and other data subsequent to the data B. In this example, obviously, BCF in the BCFG in the first target sub-block can be successfully matched, but from data matching cannot be performed, and other target data subsequent to the first target sub-block in the target block cannot be matched either. Therefore, in this example, a final matching result obtained by means of matching is BCF, that is, a first matching result in this application document.

The first reference data herein may be the first piece of data in the reference data block of the first hash value that is in the first hash table and that is obtained by performing the operation, that is, data corresponding to a head address of the reference data block. Alternatively, the first reference data herein may be the reference data block of the first hash value that is in the first hash table and that is obtained by performing the operation.

Certainly, an amount of data included in a target sub-block participating in each hash operation, that is, a quantity of digits of data participating in the hash operation, is not limited in the embodiments of the present invention, and may be set according to a specific requirement. For example, a larger target sub-block indicates more data participating in each hash operation, lighter system workload, and a shorter time for performance of a matching process, and a smaller target sub-block indicates less data participating in each hash operation, a finer matching process, and a more accurate matching result.

In this embodiment of the present invention, if the first encoding sequence is generated according to a matching result obtained after matching is performed in the first hash table, the offset included in the first encoding sequence may be used to indicate a location, in the reference block, of reference data matching the target data that is in the target block and that is successfully matched.

Optionally, before the querying a first hash table according to the first key value, the method further includes:

obtaining a reference data block from the reference block according to a first step, where each reference data block includes n digits of reference data, the first target sub-block includes n digits of target data, and n is a positive integer; and constructing the first hash table, where the key value in the first hash table is obtained by performing the hash operation on the reference data block.

That is, the first hash table may be constructed in advance according to reference data in the known reference block, and a reference data block participating in each hash operation includes n digits of reference data. In this embodiment of the present invention, during construction of the first hash table, a data amount of reference data participating in each hash operation needs to be equal to a data amount (that is, a data amount of data included in one target sub-block) of template data participating in each operation when matching is performed on the target block. Otherwise, matching may not be performed because obtained operation results have different lengths.

Figure 2:
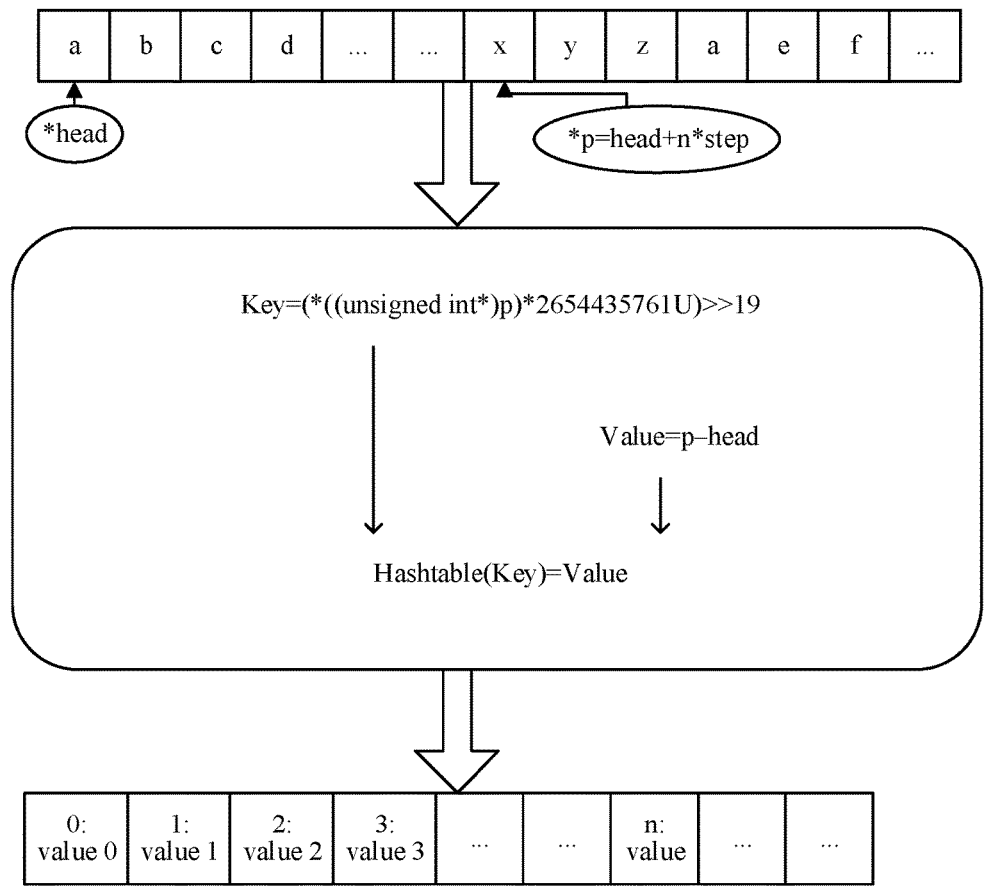
FIG. 2 is a schematic diagram of a process of constructing a first hash table according to an embodiment of the present invention.

For example, referring to FIG. 2, FIG. 2 shows a process of constructing the first hash table. The first hash table is HashTable(Key)=Value. In this embodiment, a hash operation algorithm is, for example, a rule in which an operation is performed by using a golden section prime. That is, in this embodiment, a key indicates a hash value obtained by calculating a reference data block by using a golden section prime 2654435761U. Herein, using the golden section prime is a choice during specific implementation. Alternatively, another prime may be used, that is, another hash operation algorithm may be used. This is not limited in this embodiment of the present invention. A value indicates a distance between a head address of a reference data block and a head address of a reference block, that is, indicates a location of the reference data block in the reference block. A value of n may be set as required and is not limited in the embodiments of the present invention, for example, the value may be set to 4.

In FIG. 2, Value=p-head, where p indicates a location, in a reference block, of a reference data block of a calculated key value corresponding to the Value (for example, a head address of the reference data block of the calculated key value corresponding to the Value), and head is a location of the first piece of data in the reference block (that is, a head address of the reference block). A difference between the two addresses is a distance between the first piece of data in the reference data block of the calculated key value corresponding to the Value and the first piece of data in the reference block, and the distance is a value of the Value.

In FIG. 2, Key=(*((unsigned int*)p)*2654435761U)»19, where unsigned int is a data type in a C language, p indicates a pointer that points to the head address of the reference data block of the calculated key value corresponding to the Value, and such an operation process indicates an operation performed by using the golden section prime.

Generally, a larger hash table indicates that a compression rate is increased to some extent, but performance is definitely reduced. Therefore, it is quite important to have a hash table of a suitable size. For the value, in a Delta block compression field, a block size is usually 4 K bits or 8 K bits.

Therefore, the value may be indicated by using 2 bytes (byte) (a largest allowed block is 64 K bits). In this way, when bytes are enough for use, the bytes are aligned, and there is no redundant byte. In addition, considering Off (an offset) in a subsequent encoding sequence, 15 bits may be used to indicate a distance between current data and reference data, and therefore, a 2-byte value design herein is also enough for use. For the key, considering that a minimum capacity of an L1 cache (level 1 cache) of a CPU (central processing unit) of a server is usually 32 K bits, and two hash tables are included in an encoding scheme of this embodiment of the present invention, a size of each hash table may be designed to be 16 K bits, and in this way, relatively fine speed performance can be ensured. Therefore, a quantity of keys of the first hash table may be designed to be 8 K bits, and the key is a value less than 8 K bits.

Optionally, in this embodiment, in a process of calculating a hash value to fill the first hash table, a sampling technology may be used to improve a construction and searching speed, so that the speed can be further improved. For example, a first step of data p may be shifted each time during sampling.

For example, data included in a reference block that is to participate in construction of the first hash table is WILMB-CFGAB. If it is specified that four pieces of data participate in each hash operation, that is, n is 4, in the process of calculating a hash value to fill the first hash table, the hash operation may be separately performed on reference data blocks such as WILM, ILMB, LMBC, MBCF, BCFG, CFGA, and FGAB that are included in the reference block. If a reference data block is selected by sampling, for example, it is specified that one reference data block is selected every two pieces of data, that is, a step is 2, reference data blocks in the reference block that participate in the hash operation include WILM, MBCF, and FGAB. It can be learned that by means of selecting the reference data block by sampling, a quantity of reference data blocks in the reference block that are to participate in the construction of the first hash table is reduced, and system workload is reduced.

FIG. 2 is still used as an example. In FIG. 2, the first row indicates data included in a reference block, the second row and the third row respectively indicate calculation processes of a key and a value, and the last row indicates an obtained first hash table. In the first hash table, for example, when the key is 0, a corresponding value is a value 0, and when the key is 1, a corresponding value is a value 1. For example, a first amount is n, and a head address of the reference block is head, that is, an address of data a in FIG. 2. In FIG. 2, a reference data block is selected in a sampling manner, and a first step is represented by using step. Therefore, for example, an address corresponding to data x may be head+n*step. In this way, calculation is performed by selecting the reference data block from the first row by means of sampling, to obtain the first hash table. p indicates a location, in the reference block, of a reference data block of a calculated key value corresponding to a value (for example, a head address of the reference data block of the calculated key value corresponding to the value).

In this embodiment of the present invention, the first hash table is provided, and a large quantity of processes of matching a target sub-block with a character of a reference block are replaced with a process of first searching the first hash table and after a potential matching location, in the reference block, of the target sub-block is found, backward matching the target sub-block and target data subsequent to the target sub-block in the target block with reference data at the potential matching location and other reference data subsequent to the reference data in the reference block, so that a relatively large quantity of matching processes are saved, and system performance is optimized by orders of magnitude.

In addition, in this embodiment of the present invention, the sampling technology may be used in the process of constructing the first hash table, so that the system performance is improved by several times according to a sampling step. Moreover, a miss matching loss caused by sampling can be compensated for by a backward matching process in the matching process.

Optionally, in a process of using the first hash table, the first hash table may be updated. For example, a key 1 is calculated according to a reference data block 1, a value corresponding to the reference data block 1 is a value 1, and the key 1 and the value 1 are added to the first hash table. In a processing process, the key 1 is calculated again according to another reference data block such as a reference data block 2, but a value corresponding to the reference data block 2 is a value 2. In this case, the value 1 in the first hash table may be updated by the value 2. Certainly, updating may be not performed.

If the value 1 is updated by the value 2, it indicates that in a subsequent process of searching the first hash table to perform matching, matched data that is closer to the head address of the reference block is found. If the value 1 is not updated by the value 2, it indicates that in a subsequent process of searching the first hash table to perform matching, matched data that is relatively far from an endpoint is found. In this embodiment of the present invention, the first target sub-block and the target data subsequent to the first target sub-block in the target block are backward matched with the first reference data and the other reference data subsequent to the first reference data in the reference block, so as to compensate, as much as possible, for a loss caused because the sampling technology is used in the process of constructing the first hash table.

Optionally, before the generating a first encoding sequence, the method further includes:

matching target data prior to the first target sub-block in the target block with other reference data prior to the first reference data in the reference block.

That is, in addition to the backward matching mentioned above, the first target sub-block and the target data prior to the first target sub-block in the target block may be forward matched (or may be referred to as matched forward) with the first reference data and the other reference data prior to the first reference data in the reference block, until matching cannot be performed. In this case, the first encoding sequence is generated according to a backward matching result and a forward matching result.

In this embodiment of the present invention, in addition to backward matching, forward matching may further be performed, so that more data is matched, to reduce a quantity of subsequent matching times.

For example, data included in the target block is ABCDEFGHIJKLMNOPQRST, and n is set to 4. For example, a hash operation is performed on HIJK, to obtain a key 1, the key 1 is found in the first hash table, a value that is in the first hash table and that is corresponding to the key 1 is a value 1, corresponding reference data 1 is found in the reference block according to the value 1, and starting from the reference data 1 in the reference block, the HIJK and other target data subsequent to K in the target block are continuously matched, that is, backward matched, with reference data in the reference block. For example, target data that is successfully matched in a backward matching process is HIJKL, that is, target data M is not successfully matched. In addition, after the corresponding reference data 1 is found in the reference block, starting from the reference data 1 in the reference block, the HIJK and other target data prior to the H in the target block are continuously matched, that is, forward matched, with reference data in the reference block. For example, target data that is successfully matched in a forward matching process is FG (apart from HIJK), that is, target data E is not successfully matched. In this case, a final matching result, such as FGHIJKL, may be obtained according to a backward matching result and a forward matching result, and the encoding sequence may be generated according to the FGHIJKL, that is, a second matching result in this application document.

Forward matching and backward matching may be performed in any order.

Optionally, the first encoding sequence further includes target data that is not successfully matched, and the target data that is not successfully matched is target data between the first piece of target data that is successfully matched and a last piece of target data that is successfully matched and that is corresponding to a previous encoding sequence.

Alternatively, it may be understood as that, the target data that is not successfully matched is target data between the last piece of target data that is successfully matched in forward matching and the last piece of target data that is corresponding to a previous encoding sequence adjacent to the first encoding sequence.

For example, the first encoding sequence further includes a Lit bit that may be used to store the data that is not successfully matched.

The foregoing example is still used. For example, target data included in the target block is ABCDEFGHIJKLM-NOPQRST, and n is set to 4. For example, a hash operation is performed on HIJK, and a final matching result obtained by performing forward matching and backward matching is FGHIJKL. In this case, an encoding sequence 1 is generated according to FGHIJKL, and the encoding sequence 1 may include a matching length that is 7 and an offset that is a distance between the reference data 1 and the head address of the reference block. For example, the last piece of data in a target block corresponding to a previous adjacent encoding sequence is D in the target block, that is, target data E between ABCD and FGHIJK is not successfully matched. In this case, the encoding sequence 1 may further include a Lit bit that is used to store the target data that is not successfully matched, and in the encoding sequence 1, the target data that is not successfully matched is E, so that ABCD in the target block can be obtained according to the previous adjacent encoding sequence in a decoding process, and EFGHIJK in the target block can be obtained according to the current encoding sequence.

Optionally, in addition to the first hash table, a second hash table may further be constructed. The second hash table is a hash table corresponding to the target block. For a manner for constructing the second hash table, refer to the manner for constructing the first hash table. A hash operation algorithm used for constructing the second hash table may be the same as the hash operation algorithm used for constructing the first hash table, and during construction of the second hash table, a data amount of target data that participates in each hash operation may also be n.

After a target sub-block is obtained, in addition to matching the target sub-block with the first hash table, the target sub-block may be further matched with the second hash table. In this case, four matching results may be obtained: 1. A hash value corresponding to a key value obtained by performing a hash operation on the target sub-block is found in both the first hash table and the second hash table. 2. A hash value corresponding to a key value obtained by performing a hash operation on the target sub-block is not found in the first hash table, and the hash value corresponding to the key value obtained by performing the hash operation on the target sub-block is found in the second hash table. 3. A hash value corresponding to a key value obtained by performing a hash operation on the target sub-block is found in neither the first hash table nor the second hash table. 4. A hash value corresponding to a key value obtained by performing a hash operation on the target sub-block is found in the first hash table, and the hash value corresponding to the key value obtained by performing the hash operation on the target sub-block is not found in the second hash table. These cases are separately described below.

Case 1:

Optionally, after the performing a hash operation on the first target sub-block to obtain a first key value, the method further includes:

querying the second hash table according to the first key value;

querying the second hash table according to the first key value, where a hash value that is in the second hash table and that is corresponding to a key value indicates an address of target data in the target block; and if a second hash value corresponding to the first key value is found in the second hash table, obtaining first target data according to the second hash value, matching the first piece of target data in the first target sub-block with the first target data, matching the second target data in the target block with third target data in the target block, and matching target data prior to the first target sub-block in the target block with other target data prior to the first target data in the target block, to obtain a first matching result, where the second target data is another piece of target data subsequent to the first piece of target data in the first target sub-block, and the third target data is another piece of target data subsequent to the first target data in the target block; where a matching result obtained by matching the first piece of target data in the first target sub-block with the first reference data and matching second target data in the target block with second reference data in the reference block is a second matching result; and the generating a first encoding sequence includes:

selecting a matching result with a larger data amount of matched target data from the first matching result and the second matching result, and generating the first encoding sequence according to the selected matching result, where the first encoding sequence further includes an indication bit, and the indication bit is used to: when an amount of matched target data in the first matching result is greater than that in the second matching result, indicate that data matching the target data that is successfully matched is in the target block, or the indication bit is used to: when an amount of matched target data in the second matching result is greater than that in the first matching result, indicate that data matching the target data that is successfully matched is in the reference block.

Like the first hash table, the second hash table may also be in a key-value form. For example, a hash operation is performed on data in the first target sub-block, to obtain a key, and a key and a value are in a one-to-one correspondence in the second hash table, so that the second hash table may be queried for a corresponding value according to the obtained key. For example, the value may be used to indicate a distance between a head address of data in a target sub-block corresponding to the value and a head address of a specific target block. The specific target block may be the first target block in all target blocks, or may certainly be another target block.

The second hash table may include both a key and a value. The key and the value are in a one-to-one correspondence. A process of searching the second hash table may be: performing the hash operation on target data in the first target sub-block to obtain a key (for example, referred to as a first key), and searching the second hash table for a key that is the same as the first key. If the key (for example, referred to as a second key) that is the same as the first key is found in the second hash table, the second key in the second hash table is corresponding to a value (for example, referred to as a first value), and the first value may be considered as a hash value corresponding to the first key.

In this embodiment, after the first hash table and the second hash table are separately queried for the corresponding hash value according to obtained operation results, when the corresponding hash value is found in both the first hash table and the second hash table, matching may be separately performed in the first hash table and the second hash table.

That is, the first hash value corresponding to the first key value is found in the first hash table, and determining the first reference data in the reference block according to the first hash value is equivalent to determining a potential location. In this case, the first target sub-block and the target data subsequent to the first target sub-block in the target block are backward matched with the first reference data and the other reference data subsequent to the first reference data in the reference block, until matching cannot be performed, so as to compensate for a miss loss caused by a sampling process during the construction of the first hash table. An obtained matching result is referred to as the first matching result. Alternatively, in addition to backward matching, the first target sub-block and the target data prior to the first target sub-block in the target block may be forward matched with the first reference data and the other reference data prior to the first reference data in the reference block, until neither forward matching nor backward matching can be performed. A matching result obtained in this case may be considered as a largest matching result at a current matching point, and the matching result may be referred to as the first matching result.

Likewise, when the second hash value corresponding to the first key value is found in the second hash table, and the corresponding third target data in the target block is determined according to the second hash value, the first target sub-block and the target data subsequent to the first target sub-block in the target block are backward matched with the third target data and other target data subsequent to the third target data in the target block, until matching cannot be performed. An obtained matching result is referred to as the second matching result. Alternatively, in addition to backward matching, the first target sub-block and the target data prior to the first target sub-block in the target block may be forward matched with the third target data and other target data prior to the third target data in the target block, until neither forward matching nor backward matching can be performed. A matching result obtained in this case may be considered as a largest matching result at a current matching point, and the matching result may be referred to as the second matching result. A process of performing matching in the second hash table is similar to the process, described as an example above, of performing matching in the first hash table, and no more examples are provided herein.

After the two matching results are obtained, a matching result with a larger byte quantity (that is, a larger data amount) is selected from the two matching results, the selected matching result is used as a final matching result of the first key value, and the first encoding sequence is generated according to the selected matching result. In this case, the first encoding sequence may further include an indication bit, and the indication bit is used to indicate whether data matching target data corresponding to the first encoding sequence is in the reference block or the target block, that is, used to indicate whether the selected matching result is the matching result obtained according to the first hash table or the matching result obtained according to the second hash table.

If the indication bit indicates that the data matching the target data corresponding to the first encoding sequence is in the reference block, an offset in the first encoding sequence is used to indicate a distance between an address of the first piece of reference data (may be the first reference data or may be data prior to the first reference data) that is in the reference block and that is successfully matched and the head address of the reference block. If the indication bit indicates that the data matching the target data corresponding to the first encoding sequence is in the target block, the offset in the first encoding sequence is used to indicate a distance between an address of the first piece of target data (may be the first target data or may be data prior to the first target data) that is in the target block and that is successfully matched and a head address of a specific target block.

In this case, a same hash value may appear in both the first hash table and the second hash table, and therefore, two matching results may be obtained when query and matching are performed on the tables according to an operation result. In this case, a matching result with a larger data amount may be selected for encoding, so that matching accuracy can be improved, and a compression rate can be increased.

Optionally, the method further includes:

updating the second hash table, so that the hash value that is in the second hash table and that is corresponding to the first key value indicates an address of the first piece of target data in the first target sub-block.

When hash operations are performed on different pieces of data by using a same hash operation algorithm, a same operation result may be obtained, that is, a same key is obtained. Alternatively, if the target block has repeated data segments, after hash operations are performed by using a same hash operation algorithm, a same operation result is usually obtained, that is, a same key is obtained.

For example, a target block 1 has two target sub-blocks: a target sub-block 1 and a target sub-block 2. Target data included in the target sub-block 1 is ABCD, and target data included in the target sub-block 2 is also ABCD, that is, the two target sub-blocks are repeated blocks in the target block 1. A hash operation is first performed on the target sub-block 1, and a key 1 is obtained. A value corresponding to the key 1 is a value 1, and the key 1 and the value 1 are stored in the second hash table. Then a hash operation is performed on the target sub-block 2, and an obtained key is also the key 1, but the target sub-block 1 and the target sub-block 2 are at different locations in the target block, that is, values corresponding to the target sub-block 1 and the target sub-block 2 are different. For example, a value corresponding to the target sub-block 2 is a value 2. In this case, the value 1 in the second hash table may be updated by the value 2.

That is, after the second hash table is queried, the hash value that is corresponding to the first key value and that is stored in the second hash table may be updated by a hash value that is corresponding to a first key value obtained. Updating herein is replacing an original hash value in the second hash table with a new hash value. In this way, it can be ensured that the hash value in the second hash table is updated in time, and a success rate of next matching is improved.

It can be learned from the foregoing description that the second hash table may be updated, or the second hash table may not be updated. For example, if the second hash table is not updated, a same hash value may appear in the first hash table and the second hash table at most once, so that time performance is relatively fine, that is, a time in which data compression is performed can be reduced.

It is proved by both theory and practice that a final compression rate, performance, and the like have no obvious difference regardless of whether the second hash table is updated or the second hash table is not updated. Therefore, it may be determined according to an actual case whether to update the second hash table.

Case 2:

Optionally, if the hash value corresponding to the first key value is not found in the first hash table, before the generating a first encoding sequence, the method further includes:

querying the second hash table according to the first key value, where a hash value that is in the second hash table and that is corresponding to a key value indicates an address of target data; and if the hash value corresponding to the first key value is found in the second hash table, obtaining first target data according to the hash value that is in the second hash table and that is corresponding to the first key value, matching the first piece of target data in the first target sub-block with the first target data, and matching the second target data in the target block with third target data in the target block, where the second target data is another piece of target data subsequent to the first piece of target data in the first target sub-block, and the third target data is another piece of target data subsequent to the first target data in the target block; and the first encoding sequence further includes an indication bit, used to indicate that the data matching the target data that is successfully matched is in the target block.

That is, after the first hash table and the second hash table are separately queried for the corresponding hash value according to the obtained first key value, when the corresponding hash value is found in the second hash table, and the corresponding hash value is not found in the first hash table, matching is performed in the second hash table.

For example, when a hash value (for example, referred to as a second hash value) corresponding to an operation result is found in the second hash table, and determining the corresponding first target data in the target block according to the second hash value is equivalent to determining a potential location. In this case, the first target sub-block and the target data subsequent to the first target sub-block in the target block are backward matched with the first target data and other target data subsequent to the first target data in the target block, so that the first encoding sequence may be generated according to an obtained matching result. Alternatively, in addition to backward matching, the first target sub-block and the target data prior to the first target sub-block in the target block may be forward matched with the first target data and other target data prior to the first target data in the target block, until neither forward matching nor backward matching can be performed. A matching result obtained in this case may be considered as a largest matching result at a current matching point, and the first encoding sequence may be generated according to the matching result.

Optionally, the method further includes:

updating the second hash table, so that the hash value that is in the second hash table and that is corresponding to the first key value indicates an address of the first piece of target data in the first target sub-block.

For description of this embodiment, refer to the description in Case 1, that is, the second hash table may be updated, or the second hash table may not be updated. For example, if the second hash table is not updated, a same hash value may appear in the first hash table and the second hash table at most once, so that time performance is relatively fine, that is, a time in which data compression is performed can be reduced.

It is proved by both theory and practice that a compression rate, performance, and the like have no obvious difference regardless of whether the second hash table is updated or the second hash table is not updated. Therefore, it may be determined according to an actual case whether to update the second hash table.

Case 3:

Optionally, after the querying a first hash table according to the first key value, the method further includes:

if the hash value corresponding to the first key value is not found in the first hash table, querying the second hash table according to the first key value; and the generating a first encoding sequence according to an obtained matching result includes:

if the hash value corresponding to the first key value is not found in the second hash table, updating the second hash table, so that the hash value that is in the second hash table and that is corresponding to the first key value indicates an address of the first piece of target data in the first target sub-block.

That is, after the first hash table and the second hash table are separately queried for the corresponding hash value according to the obtained first key value, when the corresponding hash value is found in neither the first hash table nor the second hash table, matching cannot be performed.

In this case, the hash value corresponding to the first key value may be inserted into a corresponding location in the second hash table, that is, the second hash table is updated according to the hash value corresponding to the first key value. In this way, when the first key value appears again next time, the corresponding hash value may be found in the second hash table. Certainly, it may be selected not to update the second hash table, or may be determined according to an actual case whether to update the second hash table.

Case 4:

Optionally, after the performing a hash operation on the first target sub-block to obtain a first key value, the method further includes:

querying the second hash table according to the first key value; and if the hash value corresponding to the first key value is not found in the second hash table, updating the second hash table, so that the hash value that is in the second hash table and that is corresponding to the first key value indicates an address of the first piece of target data in the first target sub-block.

That is, after the first hash table and the second hash table are separately queried for the corresponding hash value according to the obtained first key value, when the corresponding hash value is found in the first hash table, and the corresponding hash value is not found in the second hash table, matching is performed in the first hash table, and the first encoding sequence is generated according to a matching result obtained by performing matching in the first hash table. For a matching process, a process of generating the first encoding sequence, and the like, refer to the foregoing description.

In this case, the hash value corresponding to the first key value may be inserted into a corresponding location in the second hash table, that is, the second hash table is updated according to the hash value corresponding to the first key value. In this way, when the first key value appears again next time, the corresponding hash value may be found in the second hash table. Certainly, it may be selected not to update the second hash table, or may be determined according to an actual case whether to update the second hash table.

During actual using, for example, there is a reference block of 8 K bits and a to-be-encoded target block of 8 K bits. First, the first hash table may be generated according to the reference block. For a specific generation process, refer to the foregoing part of this embodiment. Then, the target block starts to be encoded. For example, the target block is ABCDEFGHIJKABCD, a step is 1, and n is 4. A hash operation is first performed on a target sub-block ABCD in the target block; after a key value corresponding to the ABCD is obtained, the first hash table is queried; and if a same key value is found in the first hash table, an encoding sequence may be output according to the foregoing part of this embodiment, or if a same key value is not found in the first hash table, the key value corresponding to the ABCD may be stored in the second hash table, and a hash value that is in the second hash table and that is corresponding to the key value is an address corresponding to data A. Then, when a target sub-block BCDE is obtained, a hash operation is performed on the target sub-block, to obtain a corresponding key value. The first hash table and the second hash table are queried, and an encoding sequence is output according to query results. For a specific processing process, refer to content of the foregoing four cases of querying two hash tables in this embodiment. When the twelfth digit of data in the target block is processed, the target sub-block ABCD appears again, and the key value corresponding to the target sub-block still cannot be found in the first hash table. However, the key value and the hash value corresponding to the target sub-block ABCD have been stored in the second hash table, and therefore, when the target sub-block ABCD appears again and needs to be matched, the hash value corresponding to the target sub-block may be found in the second hash table. By using the second hash table, a target sub-block that is to be processed in the target block can be matched with a target sub-block that has been processed in the target block, and is not matched with only reference data in the reference block, so that encoding efficiency and a success rate of matching are improved.

In this embodiment of the present invention, after a matching result is obtained, an encoding sequence may be generated according to the matching result, and the encoding sequence may be output, so as to complete an encoding process.

Figure 3:
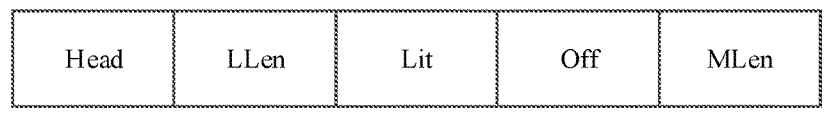
FIG. 3 is a schematic diagram of an encoding sequence according to an embodiment of the present invention.

Referring to FIG. 3, FIG. 3 is a possible schematic diagram of an encoding sequence according to an embodiment of the present invention. In FIG. 3, Head indicates a sequence head, and is a start node of an entire encoding sequence. LLen indicates a character length, is a field that may exist in the encoding sequence, and is a supplement when Head is filled with character lengths. Lit indicates a character, is a field that may exist in the encoding sequence, and is used to store a character that is in a target block and that is not successfully matched, that is, target data that is not matched. Off indicates an offset, and is a field that definitely exists in the encoding sequence. Off may include the foregoing indication bit and offset. MLen indicates a matching length, is a field that may exist in the encoding sequence, and is a supplement when Head is filled with matching lengths.

Head may be in a fixed length, for example, the length may be 1 byte. In Head, h1 most significant bits may be used to store the character length. For example, the h1 most significant bits may be stored in Head in the following manner, and h1 is 16.

0: Null;
1 to 14: used to store the character length; and
15: 15+Llen, used to store the character length.

The character length is a length of target data that is not matched from an end of previous matching to a start of current matching. 15+Llen indicates that when the character length reaches 15, new space is created for storing a leftover character length. In this case, a part that is of the character length and that exceeds 15, that is, the leftover character length, is indicated by Llen.

In Head, h2 least significant bits may be used to store the matching length. For example, the h2 least significant bits may be stored in Head in the following manner, and h2 is 16.

0: Null;
1 to 14: used to store the matching length; and
15: 15+Llen, used to store the matching length.

The matching length is a length of bytes that are continuously matched, that is, a length of data that is successfully matched. 15+Llen indicates that when the matching length reaches 15, new space is created for storing a leftover matching length. In this case, a part that is of the matching length and that exceeds 15, that is, the leftover matching length, is indicated by Llen.

Values of h1 and h2 are only examples herein, and may be specifically set as required.

Space that is in Head and that is used for storing the character length and the matching length is variable, that is, new space may be added according to actual lengths. Therefore, using the character length as an example, a shorter character length leads to less storage space occupied in Head, so that a data compression rate can be increased; and a longer character length leads to variable space of Head, so that various different requirements can be met.

LLen is used to store the character length, and a length of LLen is variable, for example, a variable range is [0, n] bytes. For example, when the character length stored in Head reaches ($2^h-1$), 1 byte is allocated as LLen for storing the character length, and when a value stored in the allocated 1 byte reaches 255, another 1 byte is allocated as LLen for storing the character length, until a value stored in a byte allocated as LLen is less than 255.

A length of Lit is variable. For example, a variable range is [0, n] bytes. Lit is used to store original data of the target block, that is, target data that is in the target block and that is not successfully matched. For example, characters QW in a target block are not successfully matched, and QW may be stored in Lit. The length of Lit may be, for example, a sum of the h1 most significant bits in Head and a quantity of bits in LLen.

A length of Off is a fixed length, for example, the length is 2 bytes. 1 most significant bit in Off may be used to store a type of a matched block, that is, used to indicate whether a data segment that successfully matches a target block is a data segment in a reference block or a data segment in the target block. For example:

0: the target block; and

1: the reference block.

15 least significant bits in Off may be used to store an offset. For example:

If the data block that is successfully matched is a data block in the target block, for example, matching is performed on a first target sub-block, and a data block that matches the first target sub-block is in the target block, the offset is used to indicate a location, in the target block, of target data matching target data that is successfully matched.

If the matched data segment is a data segment in the reference block, the offset is used to indicate a location, in the reference block, of reference data matching target data that is successfully matched.

Whether the data that is successfully matched is target data or reference data may be clearly known by using an indication of Off, so that original data can be accurately compressed and restored, the foregoing solution of performing matching by using two hash tables is effectively supported, and performance is relatively fine.

A length of MLen is variable. For example, a variable range is [0, n] bytes. For example, when the matching length stored in Head reaches (2^h2−1), 1 byte may be allocated as MLen for storing the character length, and when a value stored in the allocated 1 byte reaches 255, another 1 byte is allocated as MLen for storing the character length, until a value stored in a byte allocated as MLen is less than 255.

The encoding sequence provided in this embodiment of the present invention is applied to a field such as encoding (for example, Delta encoding), and has advantages such as a high compression rate and fine performance.

An encoding process is described above, and a manner for decoding the first encoding sequence is described below, so as to complete an entire procedure.

For example, to decode the first encoding sequence, whether the data that is successfully matched is in the reference block or in the target block may be learned according to the indication bit in Off in the first encoding sequence. For example, when the indication bit in Off is 1, it indicates that the data is in the reference block, and therefore, it may be determined that the data that successfully matches the first encoding sequence is in the reference block. A location, in the reference block, of the first piece of reference data successfully matching the first encoding sequence may be learned according to the offset in Off. For example, reference data included in the reference block is ABCDEFGHIJKLMNOPQRST, and the reference data indicated by the offset in Off is reference data I in the ABCDEFGHIJKLMNOPQRST. It is learned, according to Head of the first encoding sequence, that six digits of data are successfully matched, and two digits of data are not successfully matched. In this case, it may be learned, according to the reference block, that the data that is successfully matched is IJKLMN, and the data that is not successfully matched, for example, WK, may be obtained according to Lit in the first encoding sequence. In this case, target data corresponding to the first encoding sequence may be obtained, and the target data is WKIJKLMN.

For better understanding of technical solutions provided in the embodiments of the present invention, a relatively complete example is described below.

Figure 4A:
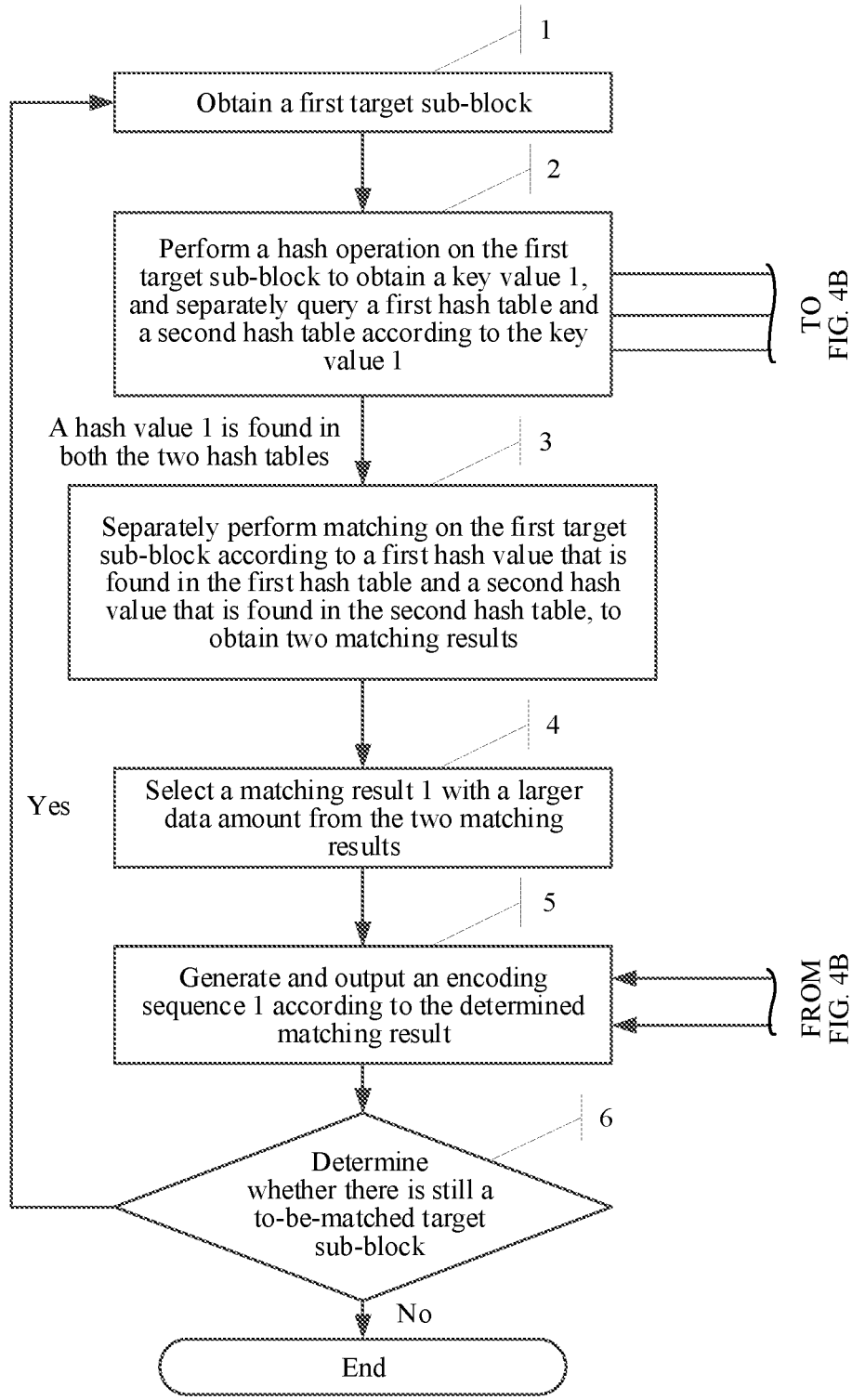
FIG. 4A and FIG. 4B are another flowchart of an encoding method according to an embodiment of the present invention.
Figure 4B:
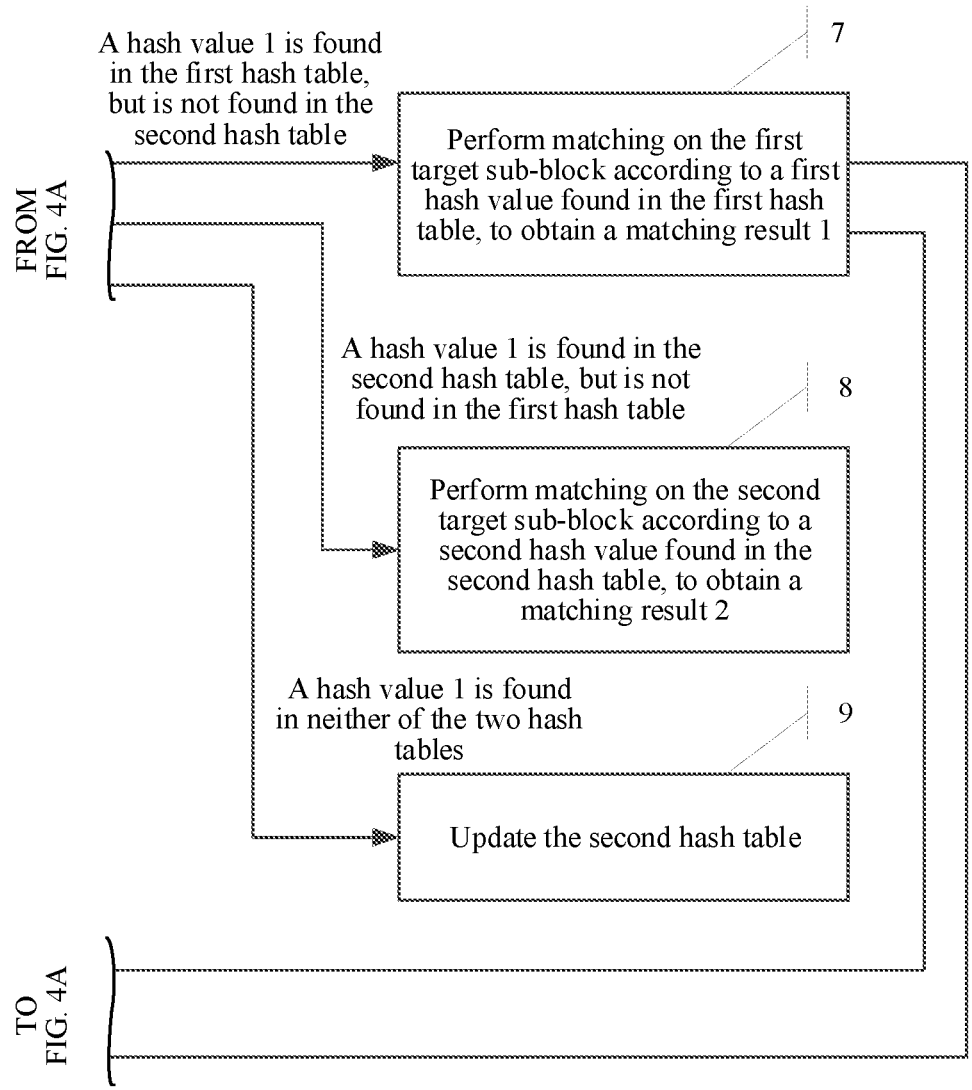

Referring to FIG. 4A and FIG. 4B, FIG. 4A and FIG. 4B are a flowchart of an encoding method according to an embodiment of the present invention.

Step 1: Obtain a first target sub-block. For example, there are a total of ten target blocks whose sizes are all 8 K bits, and all the target blocks need to be encoded. A process of encoding a target sub-block of one of the ten target blocks is described herein, and a processing process of another target block is similar. The first target sub-block may be, for example, any target sub-block of the ten target blocks, and for example, the first target sub-block includes n digits of target data.

Step 2: Perform a hash operation on the first target sub-block to obtain a key value 1, and separately query a first hash table and a second hash table according to the key value 1. If a hash value 1 corresponding to the key value 1 is found in both the first hash table and the second hash table, step 3 is performed; if the hash value 1 corresponding to the key value 1 is found in the first hash table, and the hash value 1 corresponding to the key value 1 is not found in the second hash table, step 7 is performed; if the hash value 1 corresponding to the key value 1 is not found in the first hash table, and the hash value 1 corresponding to the key value 1 is found in the second hash table, step 8 is performed; and if the hash value 1 corresponding to the key value 1 is found in neither the first hash table nor the second hash table, step 9 is performed.

Step 3: Separately perform matching on the first target sub-block according to a first hash value that is found in the first hash table and a second hash value that is found in the second hash table, to obtain two matching results. During matching, only backward matching may be performed, or both forward matching and backward matching may be performed. In addition, the second hash value in the second hash table may further be updated according to a hash value corresponding to a first key value. For a matching process, refer to the foregoing description.

Step 4: Select a matching result with a larger data amount from the two matching results. For example, a matching result 1 is selected.

Step 5: Generate and output an encoding sequence 1 according to the determined matching result. For included content, a format, and the like that are of the encoding sequence 1, refer to the related description in the procedure in FIG. 1. The determined matching result may be the matching result 1, or may be a matching result 2 that is to be described subsequently. Step 6 is performed.

Step 6: Determine whether there is still a to-be-matched target sub-block. If there is still a to-be-matched target sub-block, step 1 is performed. If there is no to-be-matched target sub-block, the procedure ends.

Step 7: Perform matching on the first target sub-block according to a first hash value found in the first hash table, to obtain a matching result, for example, a matching result 1. Step 5 is performed. The matching result may be a matching result obtained by performing backward matching, or may be a matching result obtained by performing both forward matching and backward matching. In addition, a second hash value in the second hash table may further be updated according to a hash value corresponding to a first key value.

Step 8: Perform matching on the first target sub-block according to a second hash value found in the second hash table, to obtain a matching result, for example, a matching result 2. Step 5 is performed. The matching result may be a matching result obtained by performing backward matching, or may be a matching result obtained by performing both forward matching and backward matching. In addition, the second hash value in the second hash table may further be updated according to a hash value corresponding to a first key value.

Step 9: Update a second hash value in the second hash table according to a hash value corresponding to a first key value.

For the related matching process, the process of generating the encoding sequence, content such as information included in the encoding sequence, and other content that is not described in detail in the procedure in FIG. 4A and FIG. 4B, refer to the related description in the procedure in FIG. 1.

A device in the embodiments of the present invention is described below with reference to the accompanying drawings.

Figure 5:
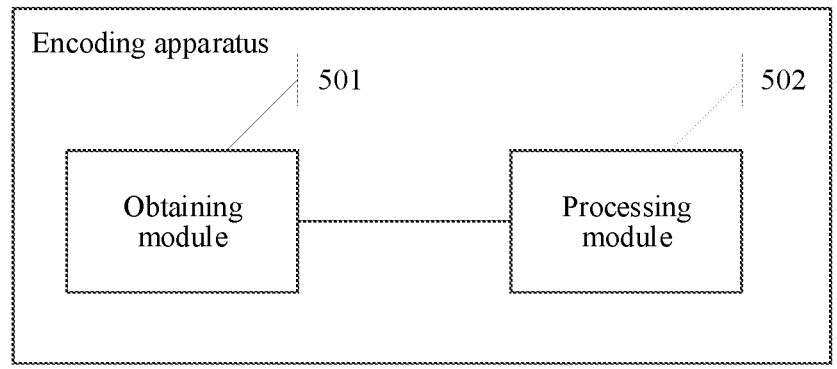
FIG. 5 is a structural block diagram of an encoding apparatus according to an embodiment of the present invention.

Referring to FIG. 5, based on a same inventive concept and the foregoing embodiments, an embodiment of the present invention provides an encoding apparatus. The encoding apparatus may include an obtaining module 501 and a processing module 502, and the encoding apparatus may be configured to implement the method in the procedure in FIG. 1 and the procedure in FIG. 2.

For example, the obtaining module 501 may be configured to obtain a first target sub-block, and all other steps in the procedure in FIG. 1 and the procedure in FIG. 2 may be performed by the processing module 502. Each step has been described in the foregoing embodiments, and therefore, details are not described herein again. For functions implemented by the obtaining module 501 and the processing module 502, corresponding execution processes, and the like, refer to the description in the foregoing embodiments.

Figure 6:
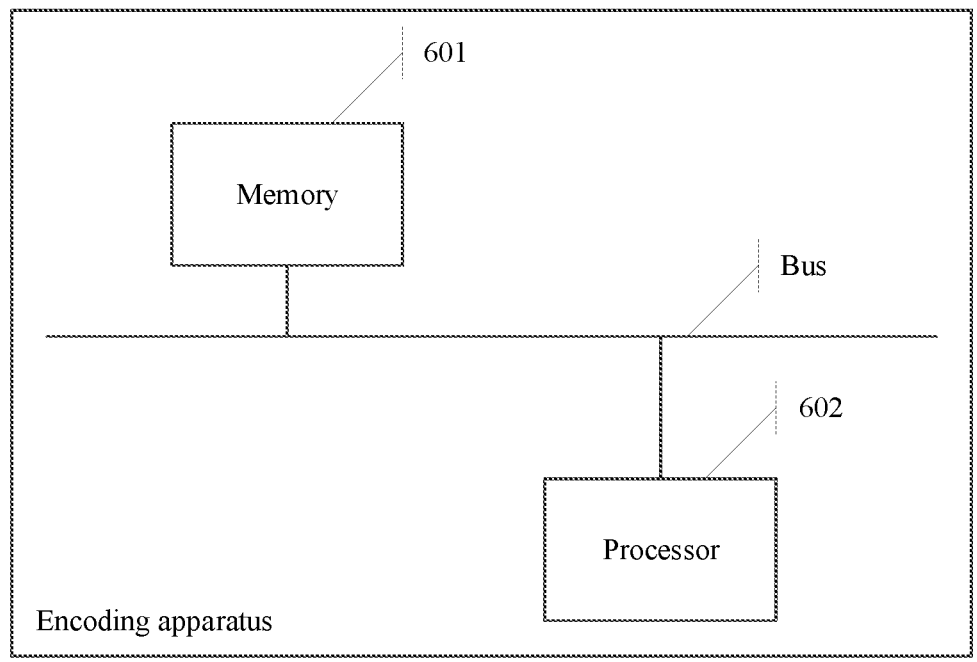
FIG. 6 is a schematic structural diagram of an encoding apparatus according to an embodiment of the present invention.

Referring to FIG. 6, based on a same inventive concept and the foregoing embodiments, an embodiment of the present invention provides an encoding apparatus. The encoding apparatus may include a memory 601 and a processor 602, and the encoding apparatus may be a device that is the same as the encoding apparatus in FIG. 5.

The processor 602 may be, for example, a CPU (central processing unit) or an ASIC (Application Specific Integrated Circuit, application-specific integrated circuit), may be one or more integrated circuits configured to control program execution, may be a hardware circuit developed by using an FPGA (Field Programmable Gate Array, field programmable gate array), or may be a baseband chip. There may be one or more memories 601. The memory 601 may include a ROM (Read Only Memory, read-only memory), a RAM (Random Access Memory, random access memory), and a magnetic disk storage.

The memory 601 may be connected to the processor 602 by using a bus (this is an example in FIG. 6), or may be connected to the processor 602 by using a dedicated connection cable.

Code corresponding to the methods described above is written permanently into a chip by designing programming for the processor 602, so that when operating, the chip can perform the methods described in the foregoing embodiments. How to design programming for the processor 602 is a technology well known to a person skilled in the art, and is not described herein.

For example, the memory 601 may be configured to store an instruction required by the processor 602 for executing a task, and the processor 602 may implement the obtaining module 501 and the processing module 502 in FIG. 5 by executing the instruction stored in the memory 601, that is, the processor 602 may execute all other steps in the procedure in FIG. 1 and the procedure in FIG. 2. Each step has been described in the foregoing embodiments, and therefore, details are not described herein again. For functions implemented by the processor 602, corresponding execution processes, and the like, refer to the description in the foregoing embodiment.

In this embodiment of the present invention, when a target sub-block (for example, referred to as a first target sub-block) in a target block is obtained, a hash operation is first performed on the target sub-block, then a first hash table is queried for a corresponding hash value according to an operation result, and a corresponding location is found in a reference block according to the hash value obtained by means of query, that is, first reference data is found, so that backward matching may be performed on the first target sub-block from the location. In this way, an approximate location is predetermined, so that a range in which matching needs to be performed is narrowed, system workload is greatly reduced, a data compression time is reduced, data compression efficiency is improved, and system performance is also improved.

It may be clearly understood by a person skilled in the art that, for the purpose of convenient and brief description, division of the foregoing function units is taken as an example for illustration. In actual application, the foregoing functions can be allocated to different function units and implemented according to a requirement, that is, an inner structure of an apparatus is divided into different function units to implement all or part of the functions described above. For a detailed working process of the foregoing system, apparatus, and unit, reference may be made to a corresponding process in the foregoing method embodiments, and details are not described herein again.

In the several embodiments provided in this application, it should be understood that the disclosed apparatus and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or all or a part of the technical solutions may be implemented in the form of a software product. The software product is stored in a storage medium and includes several instructions for instructing a computer device (which may be a personal computer, a server, or a network device) or a processor (processor) to perform all or a part of the steps of the methods described in the embodiments of this application. The foregoing storage medium includes: any medium that can store program code, such as a USB flash drive, a removable hard disk, a ROM, a RAM, a magnetic disk, or an optical disc.

The foregoing embodiments are merely used to describe the technical solutions of this application. The foregoing embodiments are merely intended to help understand the method and core idea of the present invention, and shall not be construed as a limitation on the present invention. Any variation or replacement readily figured out by a person skilled in the art within the technical scope disclosed in the present invention shall fall within the protection scope of the present invention.

What is claimed is:

1. An encoding method, comprising:
obtaining a first target sub-block, wherein the first target sub-block belongs to a target block;
performing a hash operation on the first target sub-block to obtain a first key value, and querying a first hash table according to the first key value, wherein a hash value that is in the first hash table and that corresponds to a key value indicates an address of reference data in a reference block; and if a first hash value corresponding to the first key value is found in the first hash table, obtaining, according to the first hash value, first reference data corresponding to an address indicated by the first hash value, matching a first piece of target data in the first target sub-block with the first reference data, and matching second target data in the target block with second reference data in the reference block, wherein the second target data is another piece of target data subsequent to the first piece of target data in the first target sub-block, and the second reference data is another piece of reference data subsequent to the first reference data in the reference block; and
generating a first encoding sequence according to a matching result of the first piece of target data and a matching result of the second target data, wherein the first encoding sequence comprises a matching length and an offset, the matching length is used to indicate a length of target data that is successfully matched, and the offset is used to indicate a location of data matching the target data that is successfully matched.

2. The method according to claim 1, wherein before the querying a first hash table according to the first key value, the method further comprises:
obtaining a reference data block from the reference block according to a first step, wherein each reference data block comprises n digits of reference data, the first target sub-block comprises n digits of target data, and n is a positive integer; and
constructing the first hash table, wherein the key value in the first hash table is obtained by performing the hash operation on the reference data block.

3. The method according to claim 1, wherein before the generating a first encoding sequence, the method further comprises: matching target data prior to the first target sub-block in the target block with other reference data prior to the first reference data in the reference block.

4. The method according to claim 3, wherein the first encoding sequence further comprises target data that is not successfully matched, and the target data that is not successfully matched is target data between the first piece of target data that is successfully matched and a last piece of target data that is successfully matched and that is corresponding to a previous encoding sequence.

5. The method according to claim 1, wherein after the performing a hash operation on the first target sub-block to obtain a first key value, the method further comprises:
querying a second hash table according to the first key value, wherein a hash value that is in the second hash table and that is corresponding to a key value indicates an address of target data in the target block; and if a second hash value corresponding to the first key value is found in the second hash table, obtaining first target data according to the second hash value, matching the first piece of target data in the first target sub-block with the first target data, matching the second target data in the target block with third target data in the target block, and matching target data prior to the first target sub-block in the target block with other target data prior to the first target data in the target block, to obtain a first matching result, wherein the second target data is another piece of target data subsequent to the first piece of target data in the first target sub-block, and the third target data is another piece of target data subsequent to the first target data in the target block; wherein
a matching result obtained by matching the first piece of target data in the first target sub-block with the first reference data and matching second target data in the target block with second reference data in the reference block is a second matching result; and
the generating a first encoding sequence comprises: selecting a matching result with a larger data amount of matched target data from the first matching result and the second matching result, and generating the first encoding sequence according to the selected matching result, wherein the first encoding sequence further comprises an indication bit, and the indication bit is used to: when an amount of matched target data in the first matching result is greater than that in the second matching result, indicate that data matching the target data that is successfully matched is in the target block, or the indication bit is used to: when an amount of matched target data in the second matching result is greater than that in the first matching result, indicate that data matching the target data that is successfully matched is in the reference block.

6. The method according to claim 1, wherein if the hash value corresponding to the first key value is not found in the first hash table, before the generating a first encoding sequence, the method further comprises:
querying a second hash table according to the first key value, wherein a hash value that is in the second hash table and that is corresponding to a key value indicates an address of target data; if the hash value corresponding to the first key value is found in the second hash table, obtaining first target data according to the hash value that is in the second hash table and that is corresponding to the first key value, matching the first piece of target data in the first target sub-block with the first target data, and matching the second target data in the target block with third target data in the target block, wherein the second target data is another piece of target data subsequent to the first piece of target data in the first target sub-block, and the third target data is another piece of target data subsequent to the first target data in the target block; and the first encoding sequence further comprises an indication bit, used to indicate that the data matching the target data that is successfully matched this time is in the target block.

7. The method according to claim 5, wherein the method further comprises:
updating the second hash table, so that the hash value that is in the second hash table and that is corresponding to the first key value indicates an address of the first piece of target data in the first target sub-block.

8. An encoding apparatus, comprising:
a memory, configured to store an instruction; and
a processor, configured to execute the instruction to:
obtain a first target sub-block, wherein the first target sub-block belongs to a target block;
perform a hash operation on the first target sub-block to obtain a first key value, and query a first hash table according to the first key value, wherein a hash value that is in the first hash table and that corresponds to a key value indicates an address of reference data in a reference block; and if a first hash value corresponding to the first key value is found in the first hash table, obtain, according to the first hash value, first reference data corresponding to an address indicated by the first hash value, match a first piece of target data in the first target sub-block with the first reference data, and match second target data in the target block with second reference data in the reference block, wherein the second target data is another piece of target data subsequent to the first piece of target data in the first target sub-block, and the second reference data is another piece of reference data subsequent to the first reference data in the reference block; and
generate a first encoding sequence according to a matching result of the first piece of target data and a matching result of the second target data, wherein the first encoding sequence comprises a matching length and an offset, the matching length is used to indicate a length of target data that is successfully matched this time, and the offset is used to indicate a location of data matching the target data that is successfully matched this time.

9. The apparatus according to claim 8, wherein the processor is further configured to:
before querying the first hash table according to the first key value, obtain a reference data block from the reference block according to a first step, wherein each reference data block comprises n digits of reference data, the first target sub-block comprises n digits of target data, and n is a positive integer; and
construct the first hash table, wherein the key value in the first hash table is obtained by performing the hash operation on the reference data block.

10. The apparatus according to claim 8, wherein the processor is further configured to:
before generating the first encoding sequence, match target data prior to the first target sub-block in the target block with other reference data prior to the first reference data in the reference block.

11. The apparatus according to claim 10, wherein the first encoding sequence further comprises target data that is not successfully matched, and the target data that is not successfully matched is target data between the first piece of target data that is successfully matched this time and a last piece of target data that is successfully matched and that is corresponding to a previous encoding sequence.

12. The apparatus according to claim 8, wherein the processor is further configured to:
after performing the hash operation on the first target sub-block to obtain the first key value, query a second hash table according to the first key value, wherein a hash value that is in the second hash table and that is corresponding to a key value indicates an address of target data in the target block; and if a second hash value corresponding to the first key value is found in the second hash table, obtain first target data according to the second hash value, match the first piece of target data in the first target sub-block with the first target data, match the second target data in the target block with third target data in the target block, and match target data prior to the first target sub-block in the target block with other target data prior to the first target data in the target block, to obtain a first matching result, wherein the second target data is another piece of target data subsequent to the first piece of target data in the first target sub-block, and the third target data is another piece of target data subsequent to the first target data in the target block; wherein
a matching result obtained by matching the first piece of target data in the first target sub-block with the first reference data and matching second target data in the target block with second reference data in the reference block is a second matching result; and
select a matching result with a larger data amount of matched target data from the first matching result and the second matching result, and generate the first encoding sequence according to the selected matching result, wherein the first encoding sequence further comprises an indication bit, and the indication bit is used to: when an amount of matched target data in the first matching result is greater than that in the second matching result, indicate that data matching the target data that is successfully matched this time is in the target block, or the indication bit is used to: when an amount of matched target data in the second matching result is greater than that in the first matching result, indicate that data matching the target data that is successfully matched this time is in the reference block.

13. The apparatus according to claim 8, wherein the processor is further configured to:
if the hash value corresponding to the first key value is not found in the first hash table, query a second hash table according to the first key value before generating the first encoding sequence, wherein
a hash value that is in the second hash table and that is corresponding to a key value indicates an address of target data; and if the hash value corresponding to the first key value is found in the second hash table, obtain first target data according to the hash value that is in the second hash table and that is corresponding to the first key value, match the first piece of target data in the first target sub-block with the first target data, and match the second target data in the target block with third target data in the target block, wherein the second target data is another piece of target data subsequent to the first piece of target data in the first target sub-block, and the third target data is another piece of target data subsequent to the first target data in the target block; and
the first encoding sequence further comprises an indication bit, used to indicate that the data matching the target data that is successfully matched this time is in the target block.

14. The apparatus according to claim 12, wherein the processor is further configured to:

update the second hash table, so that the hash value that is in the second hash table and that is corresponding to the first key value indicates an address of the first piece of target data in the first target sub-block.

15. A non-transitory computer readable storage medium storing instructions which, when executed by an encoding apparatus, causes the encoding apparatus to perform operations comprising:
obtaining a first target sub-block, wherein the first target sub-block belongs to a target block;
performing a hash operation on the first target sub-block to obtain a first key value, and querying a first hash table according to the first key value, wherein a hash value that is in the first hash table and that corresponds to a key value indicates an address of reference data in a reference block; and if a first hash value corresponding to the first key value is found in the first hash table, obtaining, according to the first hash value, first reference data corresponding to an address indicated by the first hash value, matching a first piece of target data in the first target sub-block with the first reference data, and matching second target data in the target block with second reference data in the reference block, wherein the second target data is another piece of target data subsequent to the first piece of target data in the first target sub-block, and the second reference data is another piece of reference data subsequent to the first reference data in the reference block; and
generating a first encoding sequence according to a matching result of the first piece of target data and a matching result of the second target data, wherein the first encoding sequence comprises a matching length and an offset, the matching length is used to indicate a length of target data that is successfully matched, and the offset is used to indicate a location of data matching the target data that is successfully matched.

16. The non-transitory computer readable storage medium according to claim 15, wherein before the querying a first hash table according to the first key value, the operations further comprise:
obtaining a reference data block from the reference block according to a first step, wherein each reference data block comprises n digits of reference data, the first target sub-block comprises n digits of target data, and n is a positive integer; and
constructing the first hash table, wherein the key value in the first hash table is obtained by performing the hash operation on the reference data block.

17. The non-transitory computer readable storage medium according to claim 15, wherein before the generating a first encoding sequence, the operations further comprise: matching target data prior to the first target sub-block in the target block with other reference data prior to the first reference data in the reference block.

18. The non-transitory computer readable storage medium according to claim 17, wherein the first encoding sequence further comprises target data that is not successfully matched, and the target data that is not successfully matched is target data between the first piece of target data that is successfully matched and a last piece of target data that is successfully matched and that is corresponding to a previous encoding sequence.

19. The non-transitory computer readable storage medium according to claim 15, wherein after the performing a hash operation on the first target sub-block to obtain a first key value, the operations further comprise:
querying a second hash table according to the first key value, wherein a hash value that is in the second hash table and that is corresponding to a key value indicates an address of target data in the target block; and if a second hash value corresponding to the first key value is found in the second hash table, obtaining first target data according to the second hash value, matching the first piece of target data in the first target sub-block with the first target data, matching the second target data in the target block with third target data in the target block, and matching target data prior to the first target sub-block in the target block with other target data prior to the first target data in the target block, to obtain a first matching result, wherein the second target data is another piece of target data subsequent to the first piece of target data in the first target sub-block, and the third target data is another piece of target data subsequent to the first target data in the target block; wherein
a matching result obtained by matching the first piece of target data in the first target sub-block with the first reference data and matching second target data in the target block with second reference data in the reference block is a second matching result; and
the generating a first encoding sequence comprises: selecting a matching result with a larger data amount of matched target data from the first matching result and the second matching result, and generating the first encoding sequence according to the selected matching result, wherein the first encoding sequence further comprises an indication bit, and the indication bit is used to: when an amount of matched target data in the first matching result is greater than that in the second matching result, indicate that data matching the target data that is successfully matched is in the target block, or the indication bit is used to: when an amount of matched target data in the second matching result is greater than that in the first matching result, indicate that data matching the target data that is successfully matched is in the reference block.

20. The non-transitory computer readable storage medium according to claim 15, wherein if the hash value corresponding to the first key value is not found in the first hash table, before the generating a first encoding sequence, the operations further comprise:
querying a second hash table according to the first key value, wherein a hash value that is in the second hash table and that is corresponding to a key value indicates an address of target data; if the hash value corresponding to the first key value is found in the second hash table, obtaining first target data according to the hash value that is in the second hash table and that is corresponding to the first key value, matching the first piece of target data in the first target sub-block with the first target data, and matching the second target data in the target block with third target data in the target block, wherein the second target data is another piece of target data subsequent to the first piece of target data in the first target sub-block, and the third target data is another piece of target data subsequent to the first target data in the target block; and
the first encoding sequence further comprises an indication bit, used to indicate that the data matching the target data that is successfully matched this time is in the target block.

* * * * *